Feb. 18, 1964 L. A. ULE 3,121,843

DIODE BRIDGE PHASE DETECTOR

Filed Jan. 31, 1961

INVENTOR,
LOUIS ANTHONY ULE.

BY Jack H. Linscott

ATTORNEY.

United States Patent Office 3,121,843

Patented Feb. 18, 1964

3,121,843

DIODE BRIDGE PHASE DETECTOR

Louis A. Ule, Rolling Hills, Calif., assignor to the United States of America as represented by the Secretary of the Army Filed Jan. 31, 1961, Ser. No. 86,274
2 Claims. (Cl. 328—133)

This invention relates to phase detector circuits and, more particularly, to an improved diode phase detector for use with high carrier frequencies.

Prior to the advent of diode phase detectors, grid-controlled electron tube circuits were used in which the electron tubes were utilized as synchronous switches. These electron tube detectors have numerous disadvantages among which are: The necessity of using transformers to provide floating grid-control voltages; high impedance from cathode to ground causing hum pickup when A.-C. heaters are used; low efficiency, since the tubes used as switches have an average resistance of approximately one megohm when conducting; and feed through due to the capacity between the transformer windings and ground which, at high carrier frequencies, causes the reference signal to appear at the input resulting in a D.-C. output with no signal input.

Diode phase detectors which have been developed in the past few years have eliminated most of the above-mentioned disadvantages which are inherent in grid-controlled electron tube circuits. However, diode phase detector circuits in use prior to this invention still did not provide effective separation or isolation of the input signal from the reference signal since, in many circuits, a portion of the signal current had to flow through the internal impedance of the reference source and/or the reference signal current flowed through the diodes.

In accordance with this invention a diode phase-detector circuit is provided in which the reference signal is effectively isolated from the input signal, and operation of the circuit is essentially as though a single-pole double-throw switch actuated by the reference signal were placed between the input and output terminals.

It is a primary object of the invention to provide an improved diode phase detector circuit in which the reference signal is isolated from the input signal.

It is a second object of this invention to provide a phase measuring circuit in which the polarity and amplitude of the D.-C. output is directly proportional to the phase and amplitude of the input signal.

Another object of this invention is to provide a phase detector which is capable of large output and signal voltages.

Still another object of this invention is to provide a phase detector which permits optimum conversion of the input signal to the output signal.

A further object of this invention is to provide a phase detector which is capable of operating at high carrier frequencies without feed-through of the reference voltage in the absence of a signal.

Another object of this invention is to provide a phase detector which is insensitive to frequency and/or wave slopes of the signals used.

Other objects and features of this invention will become apparent to those skilled in the art upon consideration of the following detailed description taken in conjunction with the drawing in which.

Figure 1:
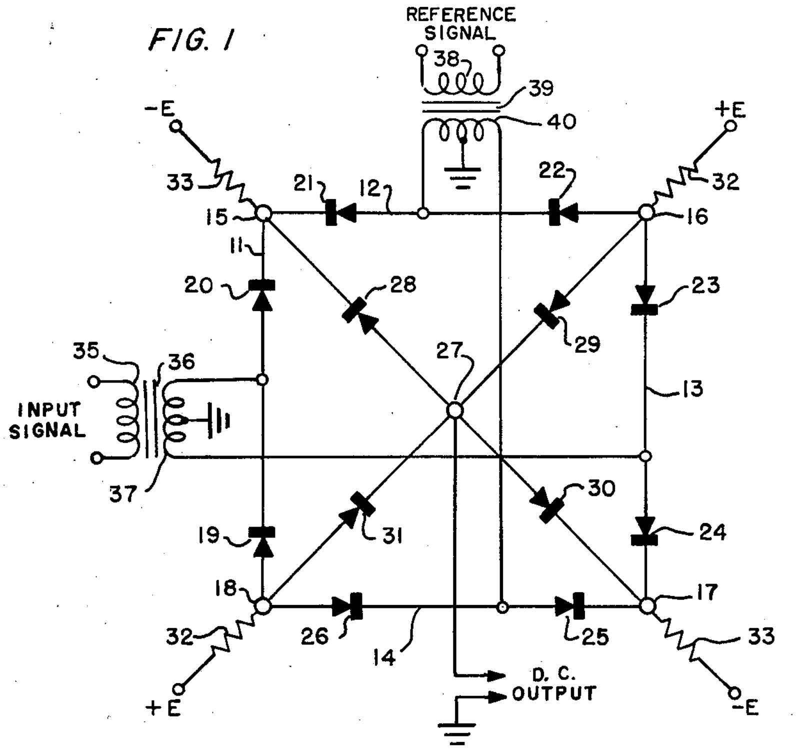
FIG. 1 is a circuit diagram of a preferred embodiment of the invention.

Referring now to FIG. 1 in detail, a phase detector constructed according to the invention is shown comprising a rectangular bridge, the four sides of which are designated by reference numbers 11, 12, 13 and 14. Sides 11 and 12 are joined together at junction 15, sides 12 and 13 are joined at junction 16, sides 13 and 14 are joined at junction 17, and sides 14 and 11 are joined at junction 18. Each of sides 11 through 14 consists of a pair of series connected diodes or unilateral conductors. Thus side 11 consists of diodes 19 and 20, side 12 consists of diodes 21 and 22, side 13 consists of diodes 23 and 24, and side 14 consists of diodes 25 and 26. Diodes 19, 20, 21, and 22 are poled to conduct toward junction 15, and diodes 23, 24, 25, and 26 are poled to conduct toward junction 17.

The bridge is also provided with a pair of diagonals joined together at their midpoints at junction 27. Diodes 28, 29, 30, and 31 are connected between junctions 15, 16, 17, and 18, respectively, and junction 27. Diodes 28 and 30 are poled to conduct toward junctions 15 and 17, respectively, and diodes 29 and 31 are poled to conduct towards junction 27.

Positive D.-C. bias voltages, +E, are supplied to junctions 16 and 18 through resistors 32, and negative D.-C. bias voltages, —E, are supplied to junctions 15 and 17 through resistors 33.

The input carrier signal is applied to primary winding 35 of transformer 36. One end of secondary winding 37 is connected to the midpoint of side 11 of the bridge between diodes 19 and 20. The other end of secondary winding 37 is connected to the midpoint of side 13 between diodes 23 and 24. A reference signal is applied to primary winding 38 of transformer 39. One end of secondary winding 40 of transformer 39 is connected to the midpoint of side 12 between diodes 21 and 22 and the other end is connected to the midpoint of side 14 between diodes 25 and 26. The midpoint of secondary windings 37 and 40 are connected to ground. The D.-C. or demodulated output voltage is taken between junction 27 and ground.

The D.-C. bias voltages, +E and —E, can be conveniently obtained from the positive and negative supplies which are readily available in any system in which the phase detector may be used. These bias voltages should exceed the input signal in magnitude. If the positive and negative bias voltages are unequal the values of resistors 32 and 33 are chosen so that the D.-C. output with no input is zero. While the resistors shown in FIG. 1 are indicated as having fixed values, they could just as well be variable resistors if different bias voltages are to be used with the system. The values of resistors 32 and 33 are also chosen so that the current flowing through them from the positive and negative bias voltages exceeds the maximum that will flow between the signal input and the output. If this were not done the output would be current limited since then several of the diodes would be cut off with excessive input.

The operation of the circuit of FIG. 1 will now be described. Initially, assume that the left-hand end of secondary winding 40 of reference signal transformer 39 is positive. This results in a positive potential being applied to junction 15 through diode 21; and junction 15 instead of being at zero volts with high current flowing through diodes 20 and 28 rises to the potential of the reference signal which is chosen to be of sufficient magnitude to cut off diodes 20 and 28. Diode 22 is cut off by the application of positive reference voltage to its cathode.

In a similar manner, a negative potential from the right-hand end of winding 40 is applied to junction 18 through diode 26 thereby cutting off diodes 19 and 31.

It can also be seen that diode 25 will be cut off leaving heavy current flow from +E to —E only through the parallel series combination of diodes 23, 29, 24 and 30.

When diodes 23, 24, 29 and 30 are conducting, they can be considered to be short circuits, and as a result, there is a direct connection between the lower end of secondary winding 37 of signal input transformer 36 and junction 27 which comprises one of the output terminals. The upper end of winding 37 is isolated from junction 27 since diodes 19 and 20 are rendered non-conducting by the reference signal.

If the input signal is in phase with the reference signal, i.e., if the lower end of winding 37 is positive when the left-hand end of winding 40 is positive, it can be seen that for the above conditions the D.-C. output will be positive with respect to ground. If the input signal is 180° out of phase with the reference signal, the lower end of winding 37 will be negative when the left-hand end of winding 40 is positive thus resulting in a negative D.-C. output with respect to ground.

When the polarity of the reference signal is reversed on the next half cycle, a similar analysis shows that diodes 19, 20, 28 and 31 are heavily conducting and that diodes 21, 23, 24, 26, 29 and 30 are cut off. This results in the isolation of the lower end of winding 37 from junction 27 since diodes 23 and 29 are non-conducting. However, the upper end of winding 37 effectively is connected directly to junction 27 since the series parallel combination of heavily conducting diodes 19, 20, 28 and 31 can be considered as a short circuit. Thus, if the signals are in phase, a positive potential with respect to ground will again appear at the D.-C. output terminals.

From the foregoing, it can be seen that when the input signal and the reference signal are in phase, the D.-C. output will be positive; and when these signals are 180° out of phase the D.-C. output will be negative. The magnitude of the D.-C. output will be practically the same as the magnitude of the input signal present on secondary winding 37 since the resistance of the diodes when they are heavily conducting is negligible. In effect the circuit operates as if a single-pole double-throw switch actuated by the reference voltage were placed between the signal input and the D.-C. output.

Figure 2:
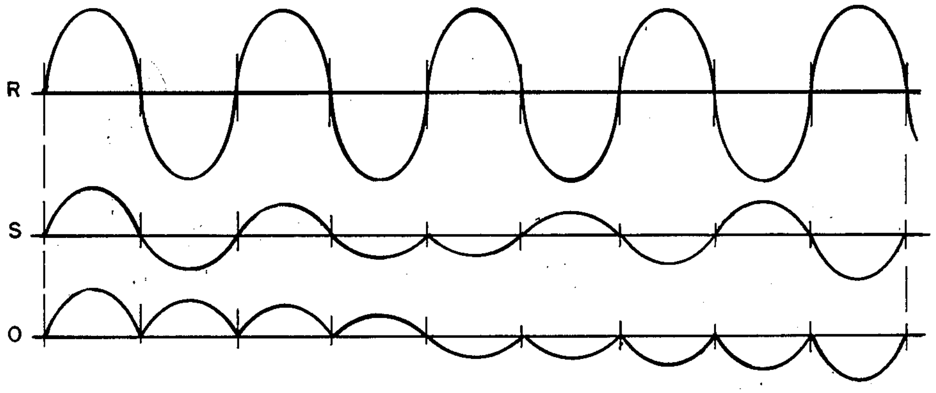
FIG. 2 shows waveforms useful in illustrating the operation.

FIG. 2 shows the waveforms which result from the above operation. The reference signal R is shown in the top line, the signal input S is shown in the middle line, and the D.-C. output O is shown in the bottom line. It is readily apparent that when S and R are in phase, R acts as a switch to cause the output voltage to be positive, and that when S and R are 180° out of phase the output voltage is negative.

The D.-C. output voltage is not sensitive to unbalance in the D.-C. bias voltage. However, balanced D.-C. bias voltages are easily obtained and unbalance can be reduced considerably if the input impedance or the output impedance or both are low. With a constant voltage source, for example, as is obtained when a cathode follower is used, balance is not critical at all. It is possible to get reliable output when the input is as low as 10 millivolts.

Transformers 36 and 39 are used merely to indicate that a push-pull input, balanced with respect to ground, is required for both the carrier signal S and the reference signal R. Such signals can be obtained without a transformer if a vacuum tube phase-inverter is used.

It is to be understood that the specific embodiment of the invention described is merely illustrative of the principles of the invention and that various changes and modifications may be made without departing from the spirit and scope of the invention as set forth in the appended claims.

What is claimed is:

1. A phase detector for determining the phase difference between an alternating current signal voltage and a reference voltage of the same frequency comprising a diode bridge having first, second, third and fourth sides, first and second diodes connected in series in said first side, third and fourth diodes connected in series in said second side, fifth and sixth diodes connected in series in said third side, seventh and eighth diodes connected in series in said fourth side, first and second diagonals connected across first and second opposite corners of said bridge, said diagonals being connected together at their midpoints to form an output terminal, said first diagonal having diodes connected therein to conduct current away from said output terminal toward said first opposite corners, said second diagonal having diodes connected therein to conduct current toward said output terminal from said second opposite corners, said first, second, third, and fourth diodes being poled to conduct current toward one of said first opposite corners, said fifth, sixth, seventh, and eighth diodes being poled to conduct current toward the other of said first opposite corners, a pair of input terminals, a first phase splitter coupled to said input terminals, one side of said phase splitter being connected to the junction between said first and second diodes, the other side of said phase splitter being connected to the junction between said fifth and sixth diodes, a pair of reference signal terminals, a second phase splitter coupled to said input terminals, one side of said phase splitter being connected to the junction between said second and third diodes, the other side of said phase splitter being connected to the junction between said seventh and eighth diodes, a source of negative D.-C. potential connected to said first opposite corners, and a source of positive D.-C. potential connected to said second opposite corners.

2. Apparatus for determining the phase difference between a pair of alternating current signals including a four-armed bridge circuit having a pair of diodes connected in series in each of said arms, the cathode of the first diode being connected to the anode of the second diode of each pair, said diodes in two of said arms being poled to conduct current toward a first corner formed by the junction of said two arms, said diodes in the other two of said arms being poled to conduct current toward a second corner formed by the junction of said other two of said arms, said second corner being diagonally opposite said first corner and connected to said first corner by a first diagonal, a second diagonal connected across a second pair of diagonally opposite corners of said bridge, said first and second diagonals being joined together at their midpoints to form an output terminal, diode means in said first diagonal poled to conduct current away from said output terminal, diode means in said second diagonal poled to conduct current toward said output terminal, a source of direct current potential connected to each of said corners, means for applying a push-pull input signal balanced with respect to ground, to two opposite arms of said bridge, and means for applying a push-pull reference balanced with respect to ground, to the other two opposite arms of said bridge whereby said reference signal causes said bridge to function as a single-pole double-throw switch between said input signal and said output terminal.

UNITED STATES PATENTS

References Cited in the file of this patent

| | | |
|---|---|---|
| 2,562,912 | Hawley | Aug. 7, 1951 |
| 2,775,714 | Curtis | Dec. 25, 1956 |
| 2,810,885 | Davis et al. | Oct. 22, 1957 |
| 2,913,675 | Curtis | Nov. 17, 1959 |
| 2,935,686 | Kerns et al. | May 3, 1960 |
| 2,982,867 | Wennerberg | May 2, 1961 |